United States Patent [19]

Edell

[11] Patent Number: 5,045,151

[45] Date of Patent: Sep. 3, 1991

[54] MICROMACHINED BONDING SURFACES AND METHOD OF FORMING THE SAME

[75] Inventor: David J. Edell, Lexington, Mass.

[73] Assignee: Massachusetts Institute of Technology, Cambridge, Mass.

[21] Appl. No.: 422,540

[22] Filed: Oct. 17, 1989

[51] Int. Cl.$^5$ .................... H01L 21/306; B44C 1/22; C03C 15/00; C03C 25/06

[52] U.S. Cl. .................... 156/647; 156/648; 156/651; 156/653; 156/657; 156/659.1; 156/662; 252/79.3; 357/55; 357/69; 357/72; 437/68; 437/211

[58] Field of Search ............... 252/79.2, 79.3; 437/68, 437/72, 73, 211, 213, 215, 219; 156/626, 643, 646, 647, 648, 651, 653, 657, 659.1, 661.1, 662; 357/69, 70, 72, 55, 73; 428/156, 173, 195, 209

[56] References Cited

U.S. PATENT DOCUMENTS

| | | | |
|---|---|---|---|
| 3,363,153 | 1/1968 | Zloczower | 437/67 X |
| 3,778,685 | 12/1973 | Kennedy | 317/234 |
| 3,793,712 | 2/1974 | Bean et al. | 156/648 |
| 3,821,099 | 6/1974 | Szedon et al. | 204/181 |
| 3,911,475 | 10/1975 | Szedon et al. | 357/72 |
| 3,961,999 | 6/1976 | Antipov | 437/73 |
| 4,029,542 | 6/1977 | Swartz | 252/79.3 X |
| 4,071,397 | 1/1978 | Estreicher et al. | 252/79.3 X |
| 4,088,516 | 5/1978 | Kondo et al. | 437/73 X |
| 4,609,936 | 9/1986 | Scharr et al. | 357/68 |
| 4,631,805 | 12/1986 | Olsen et al. | 29/588 |
| 4,642,163 | 2/1987 | Greschner et al. | 156/643 |

OTHER PUBLICATIONS

Troyk, "Packaging Problems for Implantable Sensors", Sensors Expo Proceedings, pp. 308A-1-308A-8 (1988).
Ameen et al., "Etching of High Alumina Ceramics to Promote Copper Adhesion," J. Electro. Soc., 120: 1518-1522 (1973).

Primary Examiner—William A. Powell
Attorney, Agent, or Firm—Fish & Richardson

[57] ABSTRACT

A method of encapsulating a lead bonding pad region of an integrated circuit (such as a sensor used in an implantable medical device) is disclosed. The excapsulant (such as Teflon TM -TFE) is mechanically gripped on the surface of the circuit by anchor interlock portions which are held in undercut grooves, micromachined, in a predefined pattern, in the circuit substrate. The encapsulant is held down by the portions in the grooves, forms a tight mechanical seal with the substrate surface and with the insulation around an attached lead, and blocks intrusion of contaminants along the surfaces between these materials or through the encapsulant.

41 Claims, 4 Drawing Sheets

FIG. 10

MICROMACHINED BONDING SURFACES AND METHOD OF FORMING THE SAME

BACKGROUND OF THE INVENTION

The invention was made in the course of a grant from the National Institutes of Health, and the United States Government therefore has rights in the invention.

This invention relates to bonding a material to a surface.

It is known that adhesion between a synthetic substrate and a metallized layer is improved by vertical and horizontal etching of a perforation pattern of random orientation, depth and undercutting to produce in the substrate recesses which have overhanging walls. A thin copper layer sputtered over the substrate fills the recesses and is thus mechanically locked onto the surface.

It is also known that a material such as an epoxy, a urethane, a silicone elastomer, or a polyimide, for example, may be adhesively bonded to a surface of a structure such as an integrated circuit to strengthen, insulate, and protect from contamination and corrosion the connection between an electrical lead and a bonding pad of the circuit. Such integrated circuits are used in implantable medical devices.

SUMMARY OF THE INVENTION

In general, in one aspect, the invention features a lead bonding pad region exposed at a substrate surface that includes a pad for attaching an electrical lead and a predefined pattern of cavities in regions of the substrate adjacent the bonding pad; the openings of the cavities in the surface are smaller than portions of the cavities lying below the surface.

In preferred embodiments, the substrate is crystalline (preferably (100) silicon), the cavities are substantially longer than their widths, the cavities in the pattern are aligned with a crystal plane in the substrate in order to take advantage of anisotropic etch technology, the cavities are parallel, the pattern is rectilinear around the pad, and at least two cavities have a center to center spacing of less than $20\mu$ and preferably less than $10\mu$.

In general, in another aspect, the invention features a method of encapsulating a lead bonding pad region with an encapsulant and also features the encapsulated lead bonding pad structure formed by the method. In preferred embodiments, the lead bonding pad region includes an attached lead. The method includes providing a predefined pattern of cavities in regions of the substrate surface adjacent the bonding pad, the openings of the cavities in the surface being smaller than portions of the cavities lying below the surface; applying an encapsulant to the bonding pad and the regions adjacent the bonding pad and permitting portions of the encapsulant to migrate into the cavities; and causing the encapsulant to harden to form an integral mass including anchor portions interlocked within the cavities connected to encapsulating portions lying on the bonding pad and the regions of the surface adjacent the bonding pad.

In general, in another aspect, a similar method can be used to encapsulate any area on a substrate surface or to bond any coating material to such a surface.

In preferred embodiments, a plurality of cavities (preferably in the form of grooves) is arranged in a rectilinear, symmetrical pattern and substantially surrounds the area being encapsulated. In another preferred embodiment, a plurality of small, rectangular cavities is arranged around the area being encapsulated in a pattern resembling a waffle. The encapsulated area, on a (100) silicon substrate, is part of an electrical connection of an integrated circuit in a medical device, implanted in a patient.

In a related aspect, the invention features a method of forming a cavity of controlled geometry and controlled surface appearance in the surface of a silicon substrate and also features the isotropic etch composition suitable for producing the controlled etching; the etch composition includes concentrated nitric acid and concentrated hydrofluoric acid, without additional water. Preferred etch compositions contain ten percent or less concentrated hydrofluoric acid; more preferred compositions contain six percent, two to five percent, or one percent hydrofluoric acid.

In another related aspect, the invention features a method of etching undercut cavities in a predefined pattern in the surface of a substrate structure that is covered with a layer of mask material. The method includes providing a predefined pattern for the cavities on the layer of mask material, etching the pattern in the mask material using a first etching chemical in a first etchant to which the substrate is resistant and etching the undercut cavities in the substrate using a second etching chemical in a second etchant to which the mask material is resistant. In the resultant structure, the openings of the cavities in the masking layer are smaller than portions of the cavities in the substrate.

In preferred embodiments, the predefined pattern is provided by forming a layer of photosensitive polymer on the mask material, exposing the photosensitive polymer in the predefined pattern, and developing the photosensitive polymer to form the pattern. An individual undercut cavity is a groove whose width (preferably $\leq 20\mu$; most preferably $\leq 10\mu$) at the widest point in the crystalline substrate is greater than twice the width (preferably $\leq 10\mu$; most preferably $\leq 5\mu$) of the groove opening in the layer of mask material. The portion of the groove furthest removed from the groove opening is preferably rectangular or more preferably V-shaped.

The microbonding (microlock) encapsulation method permits the secure attachment of a protective coating to the portion of a integrated circuit that is vulnerable to degradation caused by environmental contamination and permits the use of valuable protective coatings, such as Teflon ™, that have no inherent adhesive properties.

Protective encapsulants attached to integrated circuits by the microlock method have substantially increased surface electrical insulation and protective properties compared to adhesion bonded encapsulants. The microlock method permits the formation of a cavity or groove of precisely defined dimensions in a precisely defined location. The regularity of the groove patterns possible with this technique permits the grooves to be arrayed extremely close together, thus ensuring a large number of coating/substrate interlocks per unit area. A groove pattern can be oriented to maximize the barrier against outside leakage and contamination, and the groove geometry can be chosen to maximize the path (and hence time) a contaminating fluid must take to reach the protected region of the circuit and to maximize the strength of the coating/substrate bond.

The microlock bond between the coating and the substrate is not adversely affected by water absorption by the coating, which, with traditional adhesively attached coatings, causes degradation of the adhesive chemical bonds at the substrate/coating interface, electrical current leakage, electrochemical damage, and eventual delamination of the coating. If the coating is chosen to have mismatched thermal expansion and water absorption properties compared to the substrate, differential swelling of the coating will provide even tighter bonding and substantially increased peel strength rather than delamination. Coatings attached by the micromachined bonding method are expected to have a lifetime of decades before degradation in contrast to the two to three month lifetime for coatings attached by adhesion.

Sensors with lead bonding pad regions protected by the microbonding encapsulation method can be used not only as implantable medical devices, but also in similar hostile environments in military, space, communications, robotic, or automotive applications. In addition, for microchip structures not requiring an exposed electrical contact (such as sensors require), which are traditionally sealed from the external environment in a metal cannister package, the microlock encapsulation method, by completely protecting the vulnerable regions of the circuit for a long period of time, makes additional sealing with a cannister unnecessary and permits increased miniaturization of such structures. Alternatively, the microbonding method can be used to attach two surfaces together, with the coating material serving the function of an adhesive.

Other features and advantages of the invention will be apparent from the following description of the preferred embodiment and from the claims.

DESCRIPTION OF THE PREFERRED EMBODIMENT

We first briefly describe the drawings.

STRUCTURE

Referring to FIGS. 1-4, in an integrated circuit sensor 10 (such as that used in an implantable medical device) the electrical connection between a circuit element 14 and an attached lead 18, through lead bonding pad 16, is protected from the external environment by a Teflon TM encapsulant 40. Encapsulant 40 is mechanically gripped on the surface 26 of the circuit by anchor interlock portions 42 (FIG. 3) which are held in undercut grooves 22, micromachined, in a predefined pattern, in the circuit substrate 28. The encapsulant is strong enough to be held down by the anchor portions in the grooves and forms a tight mechanical seal with the substrate surface and with the insulation around the attached lead and blocks intrusion of contaminants along the surfaces between these materials or through the encapsulant.

Figure 1:
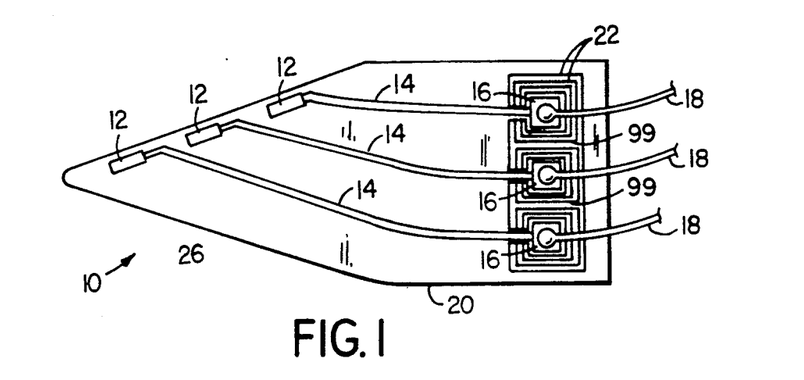
FIG. 1 is a schematic plan view of an integrated circuit sensor.
Figure 2:
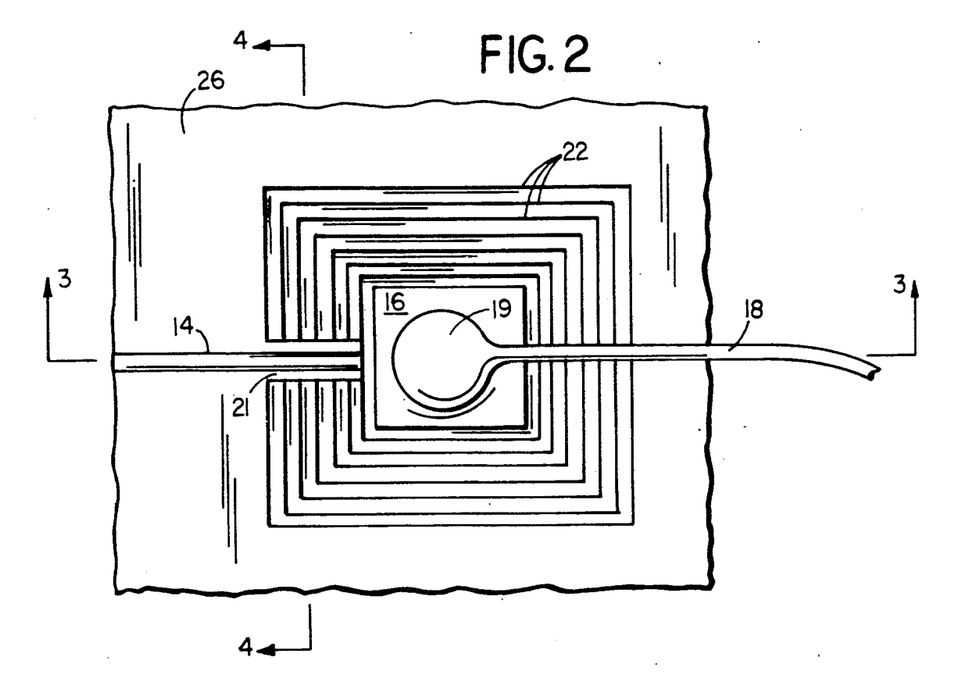
FIG. 2 is a plan view of a lead bonding pad and attached lead and a pattern of grooves around the bonding pad.

Referring to FIGS. 1 and 2, integrated circuit sensor 10 contains sensing electrodes 12, thin film polycrystalline silicon interconnect elements 14, lead bonding pads 16 ($100\mu \times 100\mu$, made of gold and platinum over tantalum), and attached gold leads 18, secured to surface layer 26 of silicon (100) substrate chip 20. Surrounding each lead bonding pad, in a rectangular pattern, are grooves (represented by lines 22 in FIGS. 1 and 2), micromachined into the chip in predefined locations.

Figure 3:
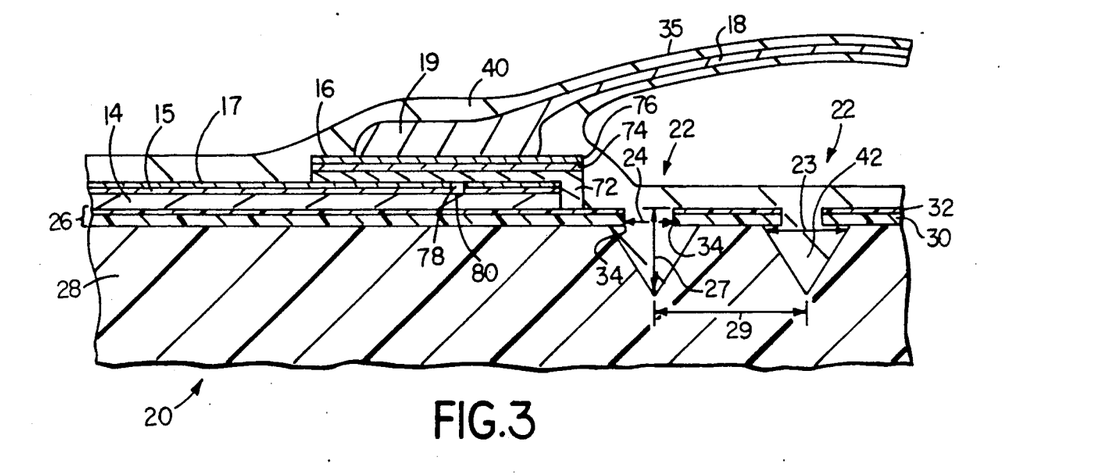
FIG. 3 is a cross-sectional view, at a larger scale, at 3-3 in FIG. 2, with encapsulant added.
Figure 4:
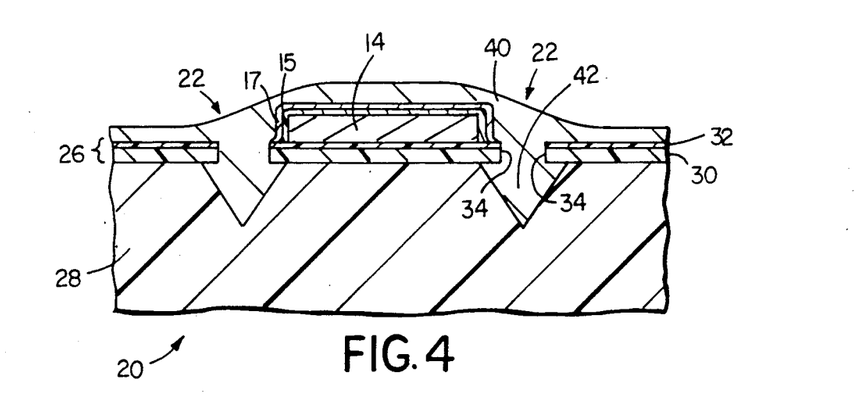
FIG. 4 is a cross-sectional view, at a larger scale, at 4-4 in FIG. 2.

Referring to FIGS. 3 and 4, surface layer 26 of silicon chip 20 is made up of a silicon dioxide layer 30 (5386 A) and a silicon nitride layer 32 (1660 A) and forms a masking layer overtop the base silicon layer 28. Each groove 22 undercuts surface layer 26 by $1.5\mu$ on each side of opening 24, forming overhangs 34, and is shaped (in base layer 28) generally like a V with the width 23 ($5\mu$) of the groove at its widest point being wider than the opening 24 ($2\mu$ between overhangs 34) in surface 26. The groove depth 27 is $5\mu$, and the spacing 29 between grooves is $7\mu$ on center. The pattern of grooves 22 fills the regions 99 between lead bonding pads 16 (FIG. 1) and is designed to take advantage of the orientation of the (111) crystal planes of the (100) silicon substrate for ease of groove formation and to provide the maximum possible barrier to intrusion of contaminants (discussed in detail below).

Thin film feedthrough interconnect element 14 connects sensor 12 with bonding pad 16 (consisting of 5000 A gold layer 76, 1000 A platinum layer 74, and 4000 A base tantalum layer 72) along a narrow region 21 that interrupts the groove pattern. Feedthrough 14, $0.5\mu$ thick and $3\mu$ wide, is formed on surface 26 of the silicon chip and insulated with a thin coating of silicon dioxide 15 ($0.5\mu$) and silicon nitride 17 ($0.15\mu$). The portion of feedthrough 14 beneath bonding pad 16 is $5\mu$ wide and contains contact site 78, a small hole $3\mu$ square in the silicon dioxide/silicon nitride insulation layers (to expose the polycrystalline silicon of the feedthrough). Contact site 78 is lined at the bottom with a diffused layer of platinum silicide 80.

An encapsulant material (Teflon TM -TFE, E.I. duPont de Nemours & Co., Inc., Wilminqton, Del.) 40 forms an integral coating mass over feedthrough element 14, lead bonding pad 16, and attached lead 18, and over and in grooves 22. Encapsulant anchor portions 42 interlocked in grooves 22 by overhang shelves 34 form an interlocking structure which physically grip the coating onto the circuit surface. The Teflon TM encapsulant 40 forms a continuous structure with the Teflon TM insulation 35 on lead 18.

FABRICATION

Referring to FIGS. 1-4, first the desired integrated circuit is formed on the top of surface layer 26 of the (100) silicon substrate microchip 20. Next, in order to form the encapsulant anchoring groove pattern around lead bonding pads 16 and feed through elements 14, silicon chip 20 is coated with a standard photosensitive polymer "photoresist" used for photolithography in the semiconductor industry, and the planned groove pattern is aligned with the crystal (111) planes of the (100) silicon substrate appropriate for the anisotropic etch step. The photoresist is exposed through a standard glass mask imaged with the desired pattern for the grooves. The resultant image is developed by standard techniques.

Etching of the groove pattern into the mask layer 26 is achieved by using, in sequence, sulphur hexafluoride plasma as a silicon nitride plasma etch step and buffered hydrofluoric acid solution as a silicon dioxide etch step. The photoresist is stripped from the surface of the chip with a sulphuric acid-hydrogen peroxide solution.

Figure 5:
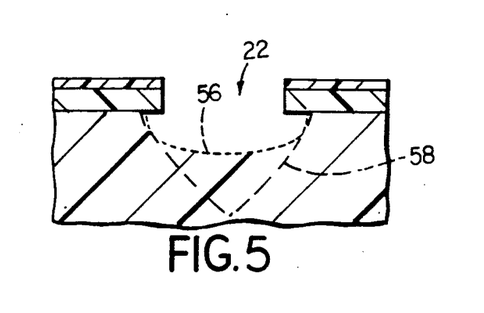
FIGS. 5 and 6 are representations of isotropic etch and anisotropic etch profiles.

Referring to FIG. 5, controlled geometry formation of grooves 22 is then produced, in two stages. The 1.5μ undercuts to form the interlock shelves 34 are etched using a concentrated hydrofluoric acid concentrated nitric acid isotropic etching system to form profile 56. An etchant of 1% concentrated hydrofluoric acid in concentrated nitric acid produces an undercut etch rate of about 1760 A per minute.

The deep, V-shaped profile 58 of groove 22 is formed using a selective (50%) cesium hydroxide etch system described in U.S. patent application Ser. No. 360,370, filed June 2, 1989, assigned to the same assignee as the present application, incorporated by reference. The shape of a groove is given by:

$$W = \frac{2D}{\tan \alpha}$$

where W = the width of the groove at the surface of the silicon, D = the depth of the groove, and α = the angle of the V with the surface, 54.7°. (In the case of (110) silicon, the groove will be more rectangular because of the orientation of the crystal planes.)

Referring again to FIG. 3, gold lead wire 18 is attached to bonding pad 16 with ultrasonic ball bonding. A fluid emulsion of Teflon TM -TFE, applied to the bonding pad and groove regions of the chip, fills each groove cavity. The microchip is placed in a low temperature oven (80° C.) to evaporate the water from the emulsion, and then on a hot plate where it is heated from the bottom. The Teflon TM powder, remaining from the dried emulsion, melts to form a liquid, and the Teflon TM coating on lead 18 softens and melts into the encapsulative material. The hot plate is turned off and the encapsulated chip is allowed to cool. Because of the chip placement on the cooling hot plate, the substrate portion of the chip containing the grooves will cool after the Teflon TM encapsulant, and a cooling groove structure (in the substrate) will close down on a solid (i e., already cooled) Teflon TM locking element and thus compress the Teflon TM material in the groove. The resultant cured Teflon TM encapsulant physically grips the surface of the integrated circuit and forms a set of closely spaced concentric seals, with only a minimal break for a feedthrough element, thus preventing electrical leakage currents and water intrusion along the surface of the device.

THEORETICAL CONSIDERATIONS FOR DETERMINING GROOVE GEOMETRY

When a sensor with encapsulated lead bonding area is implanted in a site of use, exposure to the environment generates forces in the encapsulant anchor portions. These forces have many possible causes, e.g., absorption of water by the encapsulant, differential thermal expansion, swelling of the encapsulant due to polymerization, crystal formation, or molecular changes, and the forces may be sufficiently strong to rip the mask insulator from the substrate or to break off the anchor portions. The shape of the grooves (and thus of the anchor portions) can be tailored so as to minimize the effects of these forces and to reduce the tendency for the anchor portions to extrude through the groove openings. With groove geometry (e.g., size of undercut, shape of the groove bottom, groove depth, spacing, and groove opening width) based on the character of the encapsulant, swelling of the trapped coating during immersion of the microchip will exert desired sealing forces.

The size of the undercut is chosen to represent a middle ground between the extremes where too small an undercut would result in a structure with little holding power while too large an undercut would result in an overhang which could easily deform. The appropriate geometrical configuration of the undercut needs to be redesigned for each variation in the masking layer dimensions.

The shape of the bottom portion of the groove is important for providing maximum grip of the substrate on the encapsulant material. If the groove does not have a flat bottom, i.e., is deeper in the center than on the sides, it will be more difficult to deform the central portion of the encapsulant material, and thus more difficult to unlock the sides of the encapsulant and pull it out from under interlock shelf 34. In addition, the path length of any possible leakage currents along the interface would be maximized by etching the deepest grooves possible.

The finer the groove pattern (the more closely spaced the grooves), the more connections will be possible between the encapsulant and the surface per unit area, and, therefore, the better the bonding. The increased chip surface area provided by a large number of grooves per unit area also takes better advantage of any adhesive and sealing properties of the encapsulant.

The smaller the grooves, the more closely spaced the grooves can be. The only expected lower limit on the width of the groove opening is the effective size of an individual molecule of encapsulant which must flow into a groove.

The attachment area typically is designed to surround the area to be protected and to present a long surface pathway between the lead bonding site and the external environment. Any break in the continuity of the attachment area (e.g., to leave space for a feedthrough) should be small in cross section. The encapsulant attachment must be tight all across the surface of the area, not just at the edges, to prevent entry of even a monolayer of water, and must be capable of withstanding thermal expansion and volume changes due to the absorption of water.

Other embodiments are within the following claims.

For example, this method is particularly useful for encapsulating materials with generally poor surface adhesion but other desired properties such as electrical insulating ability and encompasses any method of deposition appropriate for such materials.

Any crystalline, polycrystalline, or non-crystalline material can be used as the microchip substrate. For crystalline substrates, greater variation in the dimensions of an individual groove is possible than with other materials. Any masking material which is substantially inert to the etching chemical used to form the undercut grooves is appropriate to protect the substrate during the etching procedure. For a two-layer silicon dioxide/silicon nitride mask, the dioxide layer can range from 100 A to 1μ and the nitride layer from 500 A to 2000 A.

Figure 8:
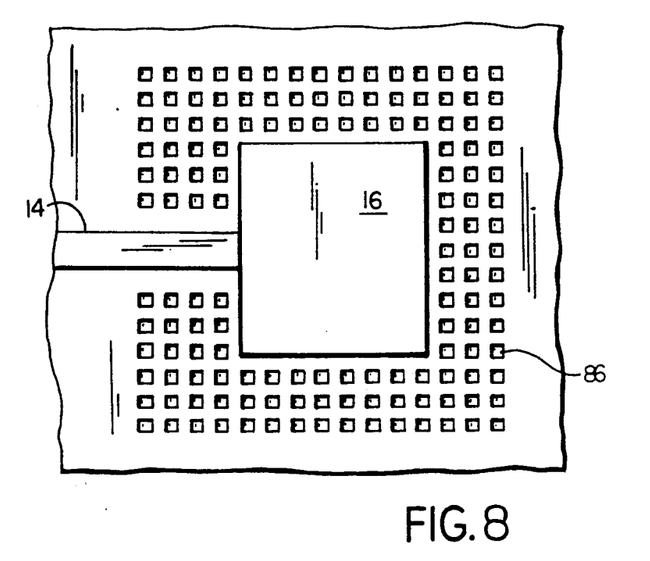
FIG. 8 is a representation of an alternate arrangement of cavities.

Other possible cavity configurations can provide similar advantages. For example, referring to FIG. 8, instead of extended grooves in a concentric arrangement around a lead bonding pad, small, rectangular cavities 86 may be arranged in a waffle pattern. Typical groove dimensions are: surface opening, $0.1\mu$–$10\mu$; mask thickness, $0.1\mu$–$1\mu$; undercut, $0.1\mu$–$5\mu$; and the spacing from the edge of the one groove undercut edge to the edge of the adjacent groove opening, $3\mu$–$20\mu$. The depth of the groove is primarily determined by the surface pattern (for crystal orientation dependent etches) and etchant, and the groove should be as deep as possible without weakening the substrate.

Any isotropic etch composition of concentrated HF and concentrated $HNO_3$ in which the percent of HF is under 10% and no water is added to dilute the concentrated acids yields acceptable undercut etch rates. The following table gives the etch rates at 21° C. and the surface texture of the resulting groove for various HF concentrations:

TABLE

| Isotropic Etch System $HF-HNO_3$ | | |
|---|---|---|
| HF Concentration | Etch Rate @ 21° C. | Texture |
| 1% | 1760 A/min | smooth |
| 2% | 4150 A/min | rough |
| 3% | 5542 A/min | rough |
| 4% | 7604 A/min | rough |
| 5% | 13400 A/min | rough |
| 6% | 23100 A/min | smooth |

Figure 7:
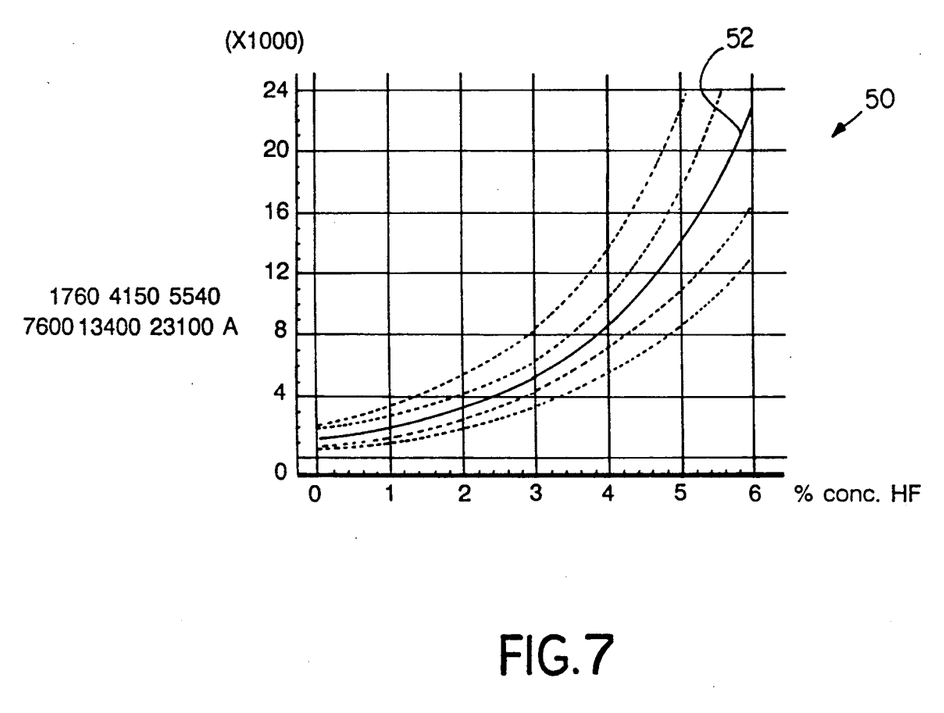
FIG. 7 is a graph of isotropic etch data.

Referring to FIG. 7, a graph of the isotropic etch data 50 shows an exponential least squares fit 52 with 95% confidence intervals. The correlation coefficient is 0.99. The percent concentration of concentrated HF in the composition is given on the abcissa. The ordinate shows the etch rate measured in angstroms per minute.

With the proper choice of HF concentration, not only the etch rate but also the texture of the interior of the groove can be controlled. Surface roughening is observed at HF concentrations between 2-5% (roughness is also apparent at 10%). Surface roughness is useful in further increasing the effective path length for any potential surface leakage as well as increasing the surface area for improved bond strength from any contribution by adhesion. Smooth groove surfaces may be chosen when controllability and uniformity of the undercut surface itself are more important. This etch is very predictable, inexpensive, requires no special apparatus, forms the required structures, and etches the silicon dioxide layer only minimally.

Any gas, liquid, or vapor isotropic etching technique is suitable for groove formation. Other categories of anisotropic etching include wet chemical, plasma, reactive ion, ion milling, or chemical etch stop techniques. Any method of forming micromachined undercut grooves of controlled geometry is suitable for the microlock technique. For example, isotropic or anisotropic etching could be used alone or the order of the isotropic and anisotropic etch steps could be reversed.

An alternate, one step, etch system would be a less selective mixture of cesium hydroxide (about 45%) where the (111) etch rate of the sidewall at 50° C. would be $0.22\mu$/hour. This would yield a $1\mu$ undercut in about 4.5 hours. The vertical etch depth for (110) silicon would be $50\mu$ while for (100) silicon, the etch depth would be defined by the final width of the groove according to the formula given above.

Figure 6:
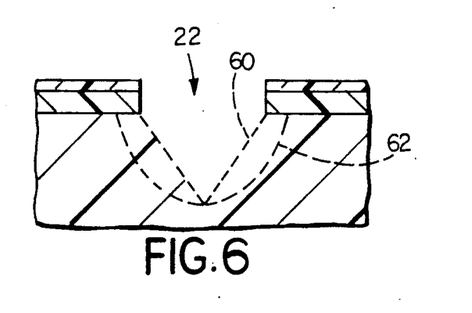

Referring to FIG. 6, if an anisotropic etchant is used before an isotropic etchant on a (100) silicon substrate, the V-shaped, non-undercut profile 60 produced can then be undercut on the sides and rounded on the bottom 62 with the isotropic etchant system.

For some uses, it may be desirable to form the groove pattern first before the circuit pattern is laid out on the surface of the chip. The feedthrouqhs could be oriented to follow the contour of a groove or to cross the groove pattern, dropping down into each groove and then returning to the surface of the substrate.

Figure 9:
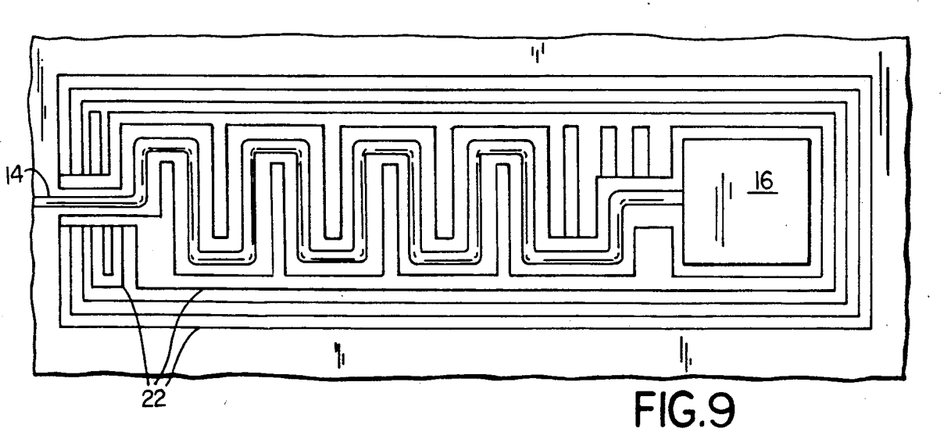
FIG. 9 is a representation of an alternate arrangement of a feedthrough interconnect element.
Figure 10:
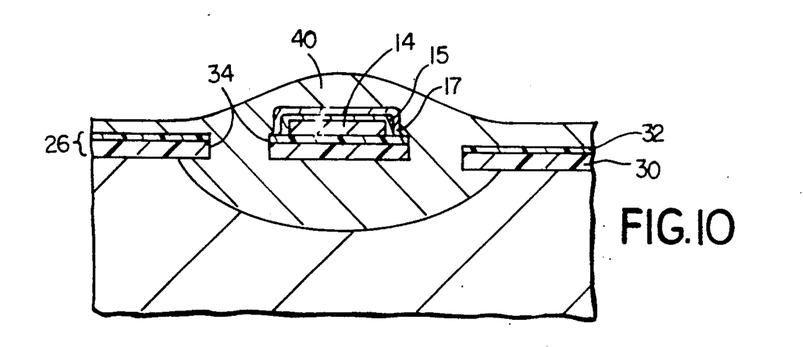
FIG. 10 is a representation of an alternate configuration for a thin film feedthrough.

Other possible configurations for the thin film feedthroughs are a zig zag pattern (FIG. 9) (i.e., a configuration designed to maximize the distance a feedthrough takes between the edge of the encapsulant and the lead bonding pad and thus maximize the distance any contaminating fluid must travel before reaching the bonding site) and a floating bridge (FIG. 10) (i.e., a configuration in which a groove on either side of a feedthrough is undercut toward the center of the feedthrough to such an extent that the grooves join and thus create a "floating bridge" structure supporting the feedthrough which can be entirely surrounded by encapsulant). The feedthroughs also may be buried under the surface using diffused lead technology.

What is claimed is:

1. A method of encapsulating an electrical conductor exposed at a substrate surface, said method comprising
providing a predefined pattern of cavities in regions of said substrate surface adjacent said conductor, the openings of said cavities in said surface being smaller than portions of the cavities lying below said surface;
applying an encapsulant to said conductor and said regions adjacent said conductor and permitting portions of said encapsulant to enter said cavities; and
causing said encapsulant to harden to form an integral mass including anchor portions interlocked within said cavities and connected to encapsulating portions lying on said conductor and said regions of said surface adjacent said conductor.

2. The method of claim 1 wherein said electrical conductor comprises a lead bonding pad, said pad being electrically attached to a lead, and said method further includes encapsulating a portion of said lead.

3. The method of claim 1 wherein said substrate is (100) silicon.

4. A lead bonding pad region on a substrate surface comprising
a bonding pad exposed at said surface for attaching an electrical lead, and
a predefined pattern of cavities in regions of said substrate adjacent said bonding pad, the openings of said cavities in said surface being smaller than portions of the cavities lying below said surface.

5. The region of claim 4 wherein said substrate is crystalline and said cavities are substantially longer than their widths, and said cavities in said pattern are aligned with a crystal plane in said substrate.

6. The region of claim 5 wherein said substrate is (100) silicon.

7. The region of claim 5 wherein said cavities are parallel.

8. The region of claim 5 wherein said pattern is rectilinear around said pad.

9. The region of claim 4 wherein at least two said cavities have a center to center spacing of less than $20\mu$.

10. The region of claim 9 wherein said center to center spacing is less than 10μ.

11. The region of claim 4 further comprising
an encapsulating mass including anchor portions held within said cavities and integrally connected to encapsulating portions covering said surface and said bonding pad region.

12. The region of claim 11 further comprising an associated lead bonded to said bonding pad and an encapsulating portion covering a portion of said lead.

13. A method of encapsulating an area on a substrate surface, said method comprising
providing a predefined pattern of cavities in regions of said substrate surface adjacent said area, the openings of said cavities in said surface being smaller than portions of the cavities lying below said surface;
applying an encapsulant to said area and said regions adjacent said area and permitting portions of said encapsulant to migrate into said cavities; and
causing said encapsulant to harden to form an integral mass including anchor portions interlocked within said cavities connected to encapsulating portions lying on said area and said regions of said surface adjacent said area.

14. The method of claim 1 or claim 13 wherein said pattern of cavities substantially surrounds said area.

15. The method of claim 14 wherein an individual said cavity comprises a groove.

16. The method of claim 15 wherein said pattern is rectilinear about said area.

17. The method of claim 14 wherein an individual said cavity is a small rectangle in opening and said pattern resembles a waffle.

18. The method of claim 14 wherein said pattern is symmetrical about said area.

19. The method of claim 13 wherein said area comprises an electrical connection.

20. The method of claim 1 or claim 13 wherein said substrate comprises (100) silicon.

21. The method of claim 1 or claim 13 wherein said substrate surface is part of an integrated circuit.

22. The method of claim 21 wherein said integrated circuit is formed as part of a medical device.

23. The method of claim 22 wherein said medical device is implanted in a patient.

24. A method of bonding a coating to a first substrate surface, said method comprising
providing a cavity of predefined geometry in said first surface, wherein the opening of said cavity in said first surface is smaller than a portion of said cavity below said opening;
applying a coating material to said first surface at said cavity and permitting a portion of said coating material to migrate into said cavity; and
causing said coating material to harden to form an integral mass including an anchor portion interlocked within said cavity, whereby said coating material is bound by said anchor portion to said first surface.

25. The method of claim 24 comprising providing a plurality of cavities.

26. The method of claim 25 further comprising
providing a cavity of predefined geometry in a second surface, wherein the opening of said cavity in said second surface is smaller than a portion of said cavity below said opening; and
applying said coating to said second surface whereby, when said coating material is caused to harden, said second surface is bonded to said first surface.

27. The method of claim 25 further comprising arranging said cavities in a regular pattern on said surface.

28. A method of forming an undercut cavity of controlled geometry and controlled surface appearance in the surface of a silicon substrate, said method comprising
selecting an isotropic etch composition, said composition comprising concentrated nitric acid and concentrated hydrofluoric acid, wherein said composition includes no additional water and wherein the percent concentrated hydrofluoric acid in said composition determines the etch rate of said composition and the surface appearance of said cavity, and
etching said surface with said composition for a time sufficient to form said cavity of controlled geometry and controlled surface appearance.

29. The method of claim 28 wherein said etch composition comprises 10 percent or less concentrated hydrofluoric acid.

30. A method of etching undercut cavities in a predefined pattern in the surface of a substrate structure, said substrate having thereon a layer of mask material, said method comprising the steps of
providing on said layer of mask material a predefined pattern for said cavities,
etching said pattern in said layer of mask material, using a first etchant comprising a first etching chemical to which said substrate is resistant, and
etching said undercut cavities in said pattern in said substrate, using a second etchant comprising a second etching chemical to which said layer of mask material is resistant, until the width of each said cavity at its widest point in said substrate is greater than twice the width of the opening of said cavity in said layer of mask material.

31. The method of claim 30 wherein said providing step comprises
forming a layer of photosensitive polymer on said mask material,
exposing said photosensitive polymer in said defined pattern, and
developing said photosensitive polymer to form said pattern.

32. The method of claim 30 wherein etching an individual said undercut cavity comprises etching a groove.

33. The method of claim 32 comprising etching a groove wherein the portion of said groove furthest removed from said opening is generally rectangular.

34. The method of claim 32 comprising etching a groove wherein the portion of said groove furthest removed from said opening is generally V-shaped.

35. The method of claim 32 comprising etching a groove wherein the opening of said groove in said layer of mask material is less than or equal to 10μ.

36. The method of claim 41 wherein said opening is less than or equal to 2μ.

37. The method of claim 32 comprising etching a groove wherein the width of the widest portion of said groove in said substrate is less than or equal to 20μ.

38. The method of claim 37 wherein said width is less than or equal to 5μ.

39. A method of encapsulating an electrical conductor exposed at a substrate surface, said method comprising providing a predefined pattern of cavities in regions of said substrate surface adjacent said conductor, the openings of said cavities in said surface being smaller than portions of the cavities lying below said surface; and applying a polymeric encapsulant to said conductor and said regions adjacent said conductor, said encapsulant forming an integral mass including anchor portions interlocked within said cavities connected to encapsulating portions covering said conductor and said regions of said surface adjacent said conductor.

40. A method of encapsulating an area exposed at a substrate surface, said method comprising providing a predefined pattern of cavities in regions of said substrate surface adjacent said area, the openings of said cavities in said surface being smaller than portions of the cavities lying below said surface; and applying a polymeric encapsulant to said area and said regions adjacent said area, said encapsulant forming an integral mass including anchor portions interlocked within said cavities connected to encapsulating portions covering said area and said regions to said surface adjacent said area.

41. A method of mechanically bonding a coating to a first substrate surface, said method comprising providing a cavity of predefined geometry in said first surface, wherein the opening of said cavity in said first surface is smaller than a portion of said cavity below said opening;

applying a polymeric coating material to said first surface at said cavity, said encapsulant forming an integral mass including an anchor portion interlocked within said cavity connected to a coating portion on said first surface, said anchor portion bonding said coating material to said first surface.

* * * * *